United States Patent
Chen et al.

(10) Patent No.: US 8,118,442 B2
(45) Date of Patent: Feb. 21, 2012

(54) LIGHT MODULE FOR LCD BACKLIGHT MODULE

(75) Inventors: Irene Chen, Taoyuan County (TW); Jian Shihn Tsang, Taipei County (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 365 days.

(21) Appl. No.: 12/435,891

(22) Filed: May 5, 2009

(65) Prior Publication Data

US 2009/0279286 A1  Nov. 12, 2009

(30) Foreign Application Priority Data

May 6, 2008 (TW) ................ 97116590 A

(51) Int. Cl.
*G02F 1/13357* (2006.01)

(52) U.S. Cl. ............... 362/97.3; 362/311.02; 362/97.2

(58) Field of Classification Search ......... 362/97.3, 362/330, 244, 246, 311.02, 339, 340, 97.1, 362/97.2, 97.4, 561, 800; 385/61–63
See application file for complete search history.

(56) References Cited

U.S. PATENT DOCUMENTS

| | | | | |
|---|---|---|---|---|
| 6,227,679 B1* | 5/2001 | Zhang et al. | ........... | 362/236 |
| 7,470,046 B2* | 12/2008 | Kao et al. | ........... | 362/332 |
| 7,658,513 B2* | 2/2010 | Peck | ........... | 362/298 |
| 7,976,187 B2* | 7/2011 | Villard | ........... | 362/246 |
| 2004/0084681 A1* | 5/2004 | Roberts | ........... | 257/79 |
| 2006/0039139 A1* | 2/2006 | Maglica et al. | ........... | 362/202 |
| 2006/0221592 A1* | 10/2006 | Nada et al. | ........... | 362/29 |
| 2006/0285311 A1* | 12/2006 | Chang et al. | ........... | 362/97 |
| 2010/0014281 A1* | 1/2010 | Kim | ........... | 362/97.2 |

FOREIGN PATENT DOCUMENTS

| | | |
|---|---|---|
| CN | 1409411 A | 4/2003 |
| CN | 1928651 A | 3/2007 |
| CN | 101191953 A | 6/2008 |
| JP | P2006-324134 A | 11/2006 |
| JP | P2007-157686 A | 6/2007 |
| WO | 2008027280 A2 | 3/2008 |

* cited by examiner

Primary Examiner — Bao Q Truong
(74) Attorney, Agent, or Firm — Altis Law Group, Inc.

(57) ABSTRACT

A light module of a LCD backlight module includes a circuit board and a plurality of light-emitting diodes (LEDs) arranged on the circuit board. Each of the LEDs has a wide far-field pattern, and each of the LEDs includes at least one LED chip and a molding unit packaging the LED chip. The LED chip is electrically connected to the circuit board.

7 Claims, 10 Drawing Sheets

LIGHT MODULE FOR LCD BACKLIGHT MODULE

BACKGROUND OF THE INVENTION (A) Field of the Invention

The present invention relates to an electronic appliance, and more particularly, to a light module of a liquid crystal display (LCD).

(B) Description of the Related Art

Light emitting diodes (LED) are increasingly applied to general household products. For example, indication apparatuses, illumination apparatuses, uniform surface illuminants, or backlight modules for LCDs.

FIG. 1 illustrates a schematic cross-section diagram of a conventional LED. The LED uses an encapsulation body 110, which is a plastic leadframe chip carrier (PLCC). Such an LED can be adapted to the backlight module of a direct-light type LCD using RGB three-color LEDs.

The LED, as shown in FIG. 1, emits light in a far-field pattern 112 as shown in FIG. 2. In FIG. 2, the light-emitting angle of an LED chip 116 is not larger than 120 degrees. FIG. 3 illustrates the relationship of the light-emitting angle and the intensity.

Referring to FIG. 2 and FIG. 3, the far-field pattern 112 of the LED device using the chip 116 of FIG. 1 is quite narrow; there is nearly no light at 120 degrees. In other words, the light-emitting area of the LED is highly concentrated.

The cup opening 102 of the reflection device 100 of the LED has a depth. If such LED is used for a light module of the backlight module of a liquid crystal display (LCD), the backlight module is not easy to manufacture with a thin profile. In addition, the concentration of the light-emitting area is not easily mixed as uniform planar illuminant for a planar light module.

Therefore, there is a demand to provide a light module of a LCD backlight module that can function as a uniform planar illuminant by mixing light and a thin backlight module of a liquid crystal display.

SUMMARY OF THE INVENTION

One aspect of the present invention provides a light module of a backlight module of a liquid crystal display. The backlight module is easily manufactured with a thin profile, and can easily mix light to form a uniform planar illuminant.

Another aspect of the present invention provides a direct type light module for LCD backlight module of a liquid crystal display.

According to the aforesaid aspects, the present invention discloses a light module of a backlight module for LCD backlight module including a circuit board and a plurality of light-emitting diodes (LEDs). The plurality of LEDs are arranged on the circuit board. Each of the LEDs has a wide far-field pattern, and each of the LEDs includes an LED chip and a molding unit packaging the LED chip. The LED chip is electrically connected to the circuit board.

By using the light module, the backlight module is easily manufactured with a thin profile and can easily mix light to form a uniform planar illuminant.

Moreover, the present invention further provides a direct type light module for a LCD backlight module including a plurality of light modules. Each light module includes a circuit board and a plurality of LEDs arranged on the circuit board. Each LED has no reflection portion for converging light. The plurality of the LEDs is connected to the circuit board. The plurality of light modules is arranged with each other for forming a plane, and the plurality of LEDs of different light modules is interlaced into a planar illuminants.

BRIEF DESCRIPTION OF THE DRAWINGS

The objectives and advantages of the present invention will become apparent upon reading the following description and upon reference to the accompanying drawings in which.

DETAILED DESCRIPTION OF THE INVENTION

The present invention relates to a light module. To clearly understand the present invention, the detailed device structure is discussed below. The implementation of the present invention is not restricted to that known by the people skilled in the art. Moreover, known devices may not be described below to avoid unnecessary limitations. The preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 4:
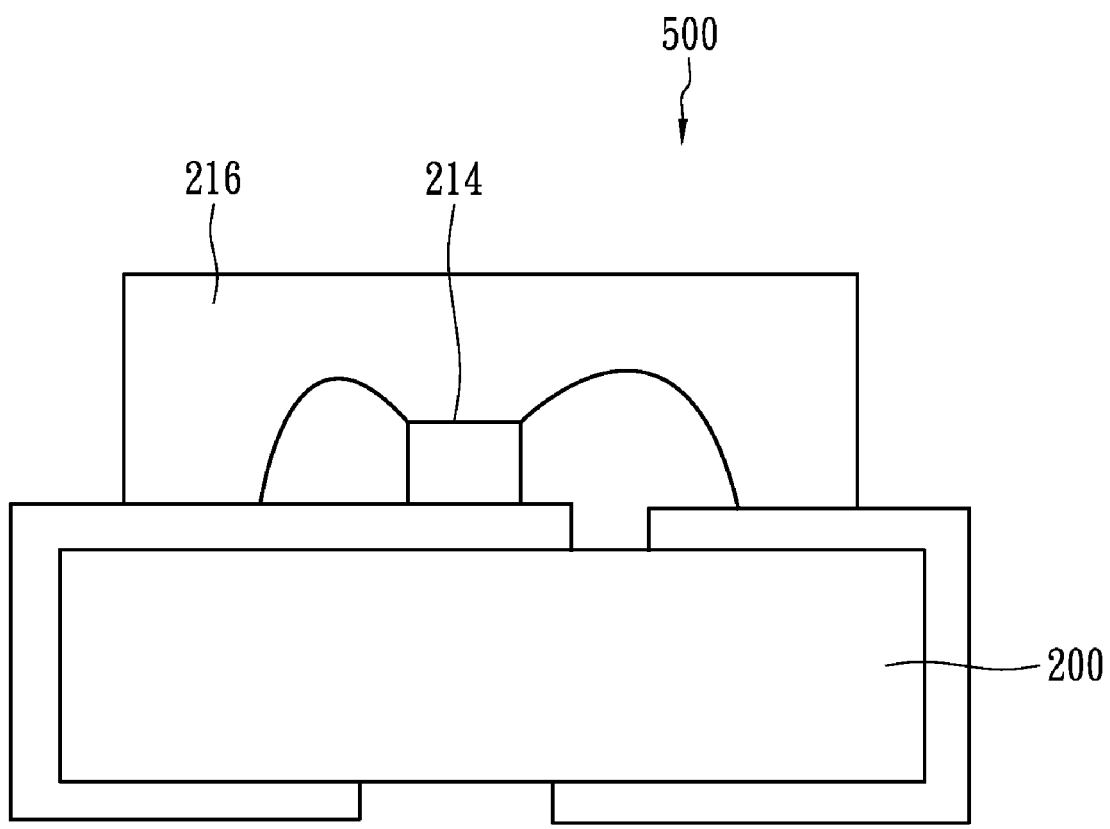
FIG. 4 illustrates the cross-sectional view of an LED in accordance with a first embodiment of the present invention.

FIG. 4 illustrates a cross-sectional view of an LED in accordance with a first embodiment of the present invention. An LED 500 includes an LED chip 214, and may further include a molding unit 216 to encapsulate the LED chip 214. The LED chip 214 may be packaged by the molding unit 216 via transfer-molding or inject-molding.

The molding unit 216 may be epoxy, silicone, or mixture of epoxy and silicone.

The LED 500 may further include a circuit board 200. According to a first embodiment of the present invention, there are plural LEDs 500. The plurality of LEDs 500 is arranged on the circuit board 200.

The LED chip 214 is electrically connected to the circuit board 200.

The circuit board 200 may be a printed circuit board (PCB), a ceramic board, an aluminum board, an alumina board, an aluminum nitride board or copper clad laminate (CCL).

Figure 5:
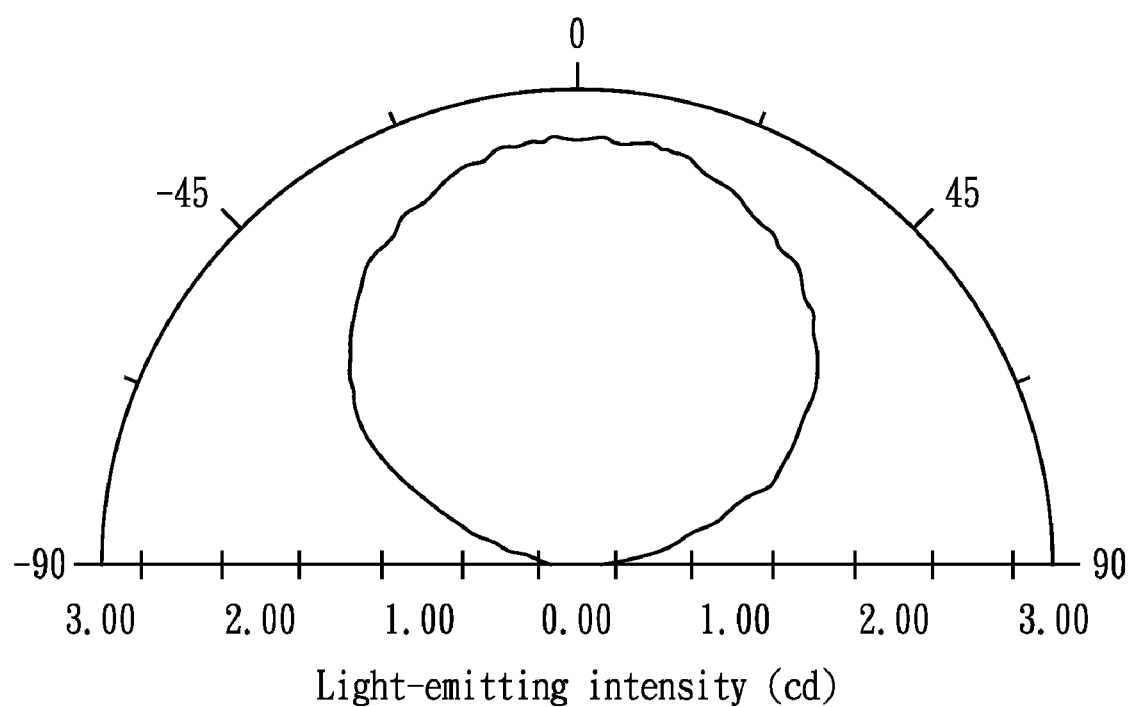
FIG. 5 illustrates a far-field pattern of the LED of FIG. 4.
Figure 6:
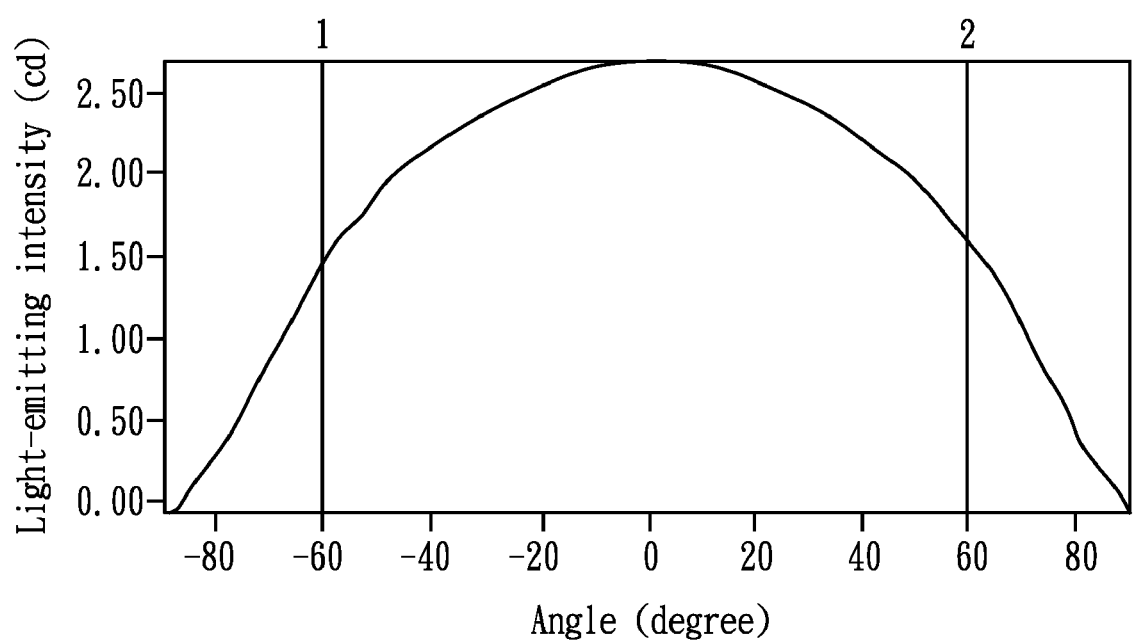
FIG. 6 illustrates the relation between the light-emitting angle and the intensity of the LED of FIG. 5.

According to the first embodiment of the present invention, the LED of FIG. 4 may have a far-field pattern. FIG. 5 illustrates the far-field pattern 212 of the LED of FIG. 4. In an embodiment, when the light-emitting angle of the LED 500 is at 120 degrees, the light intensity is still more than 50% of the intensity at frontage. FIG. 6 illustrates the relation of the light-emitting angle and the intensity of the LED shown in FIG. 5.

Figure 1:
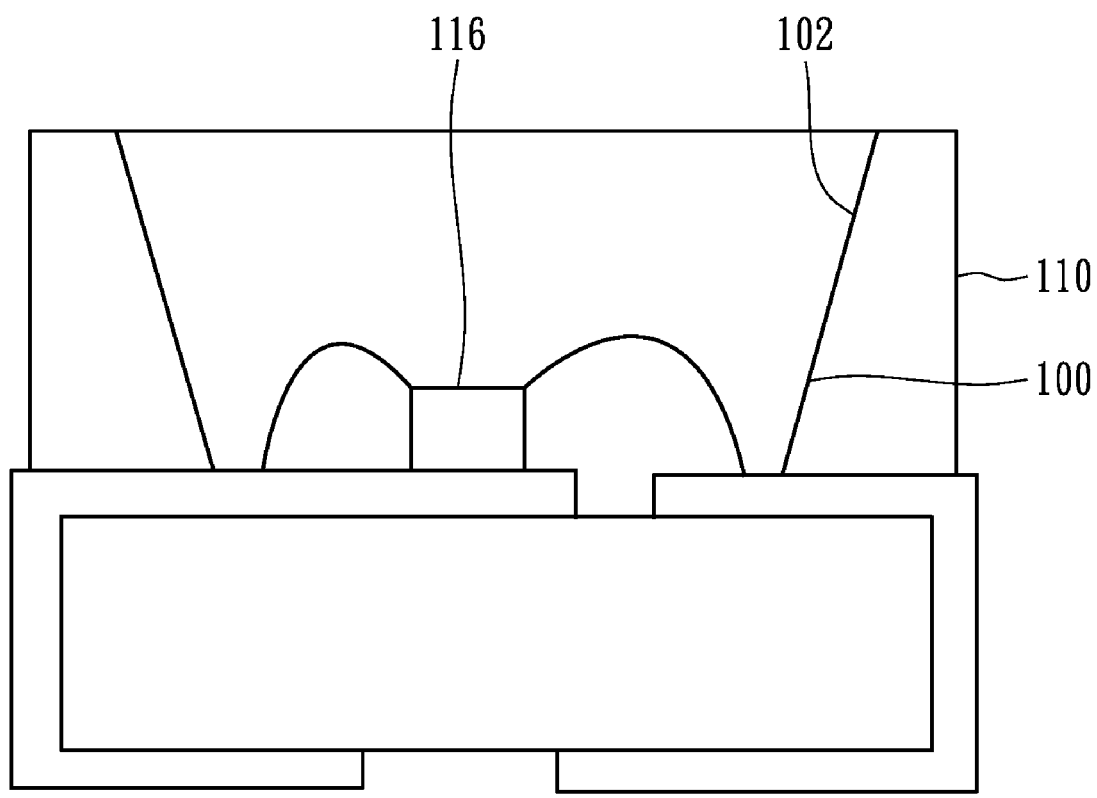
FIG. 1 illustrates a cross-sectional view of an LED.
Figure 2:
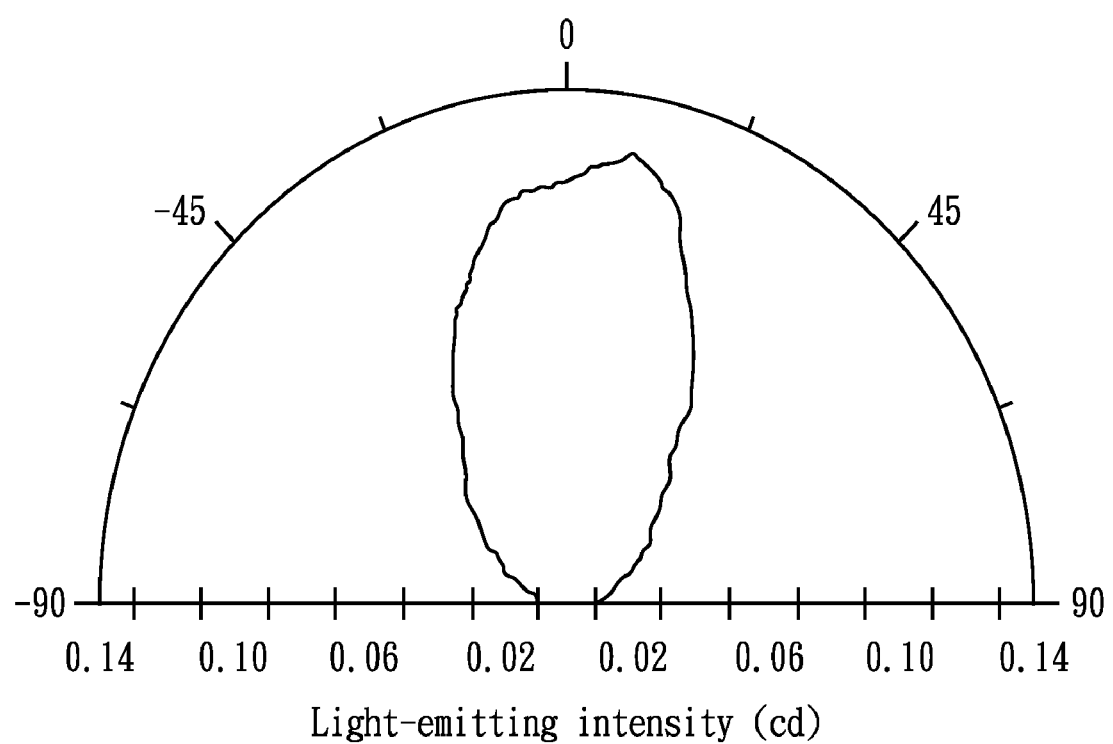
FIG. 2 illustrates a far-field pattern of the LED of FIG. 1.
Figure 3:
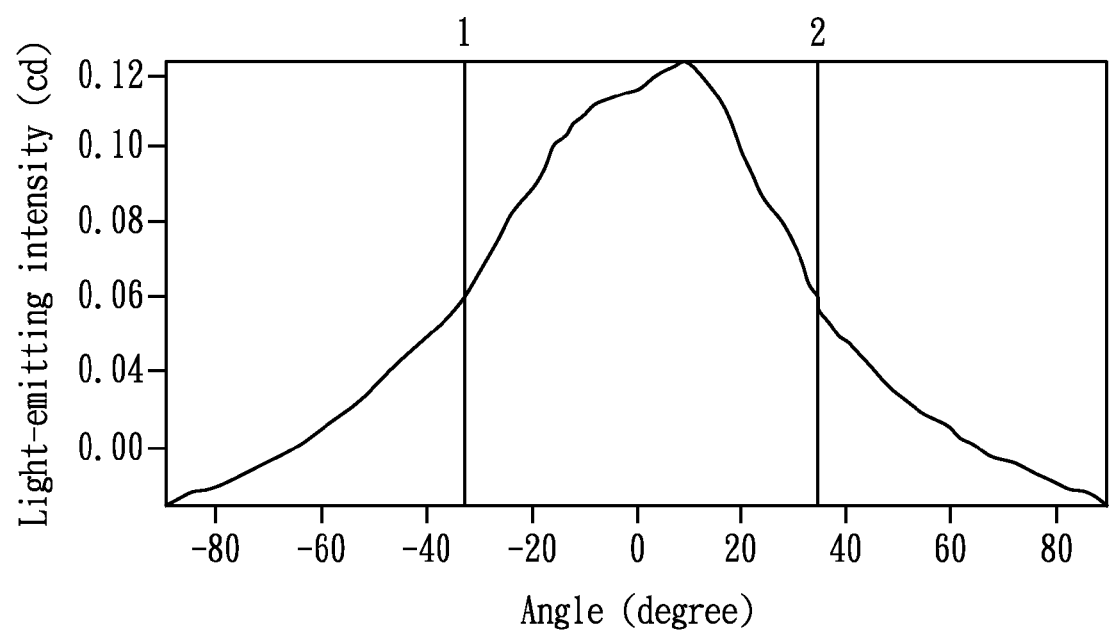
FIG. 3 illustrates the relation between the light-emitting angle and the intensity of the LED of FIG. 2.

Referring to FIG. 5 and FIG. 2, the far-field pattern 212 of the LED 500 of the first embodiment is wider than the far-field pattern 112 of the LED of FIG. 1; this is because the LED 500 has no reflection apparatus to accumulate light.

Figure 7:
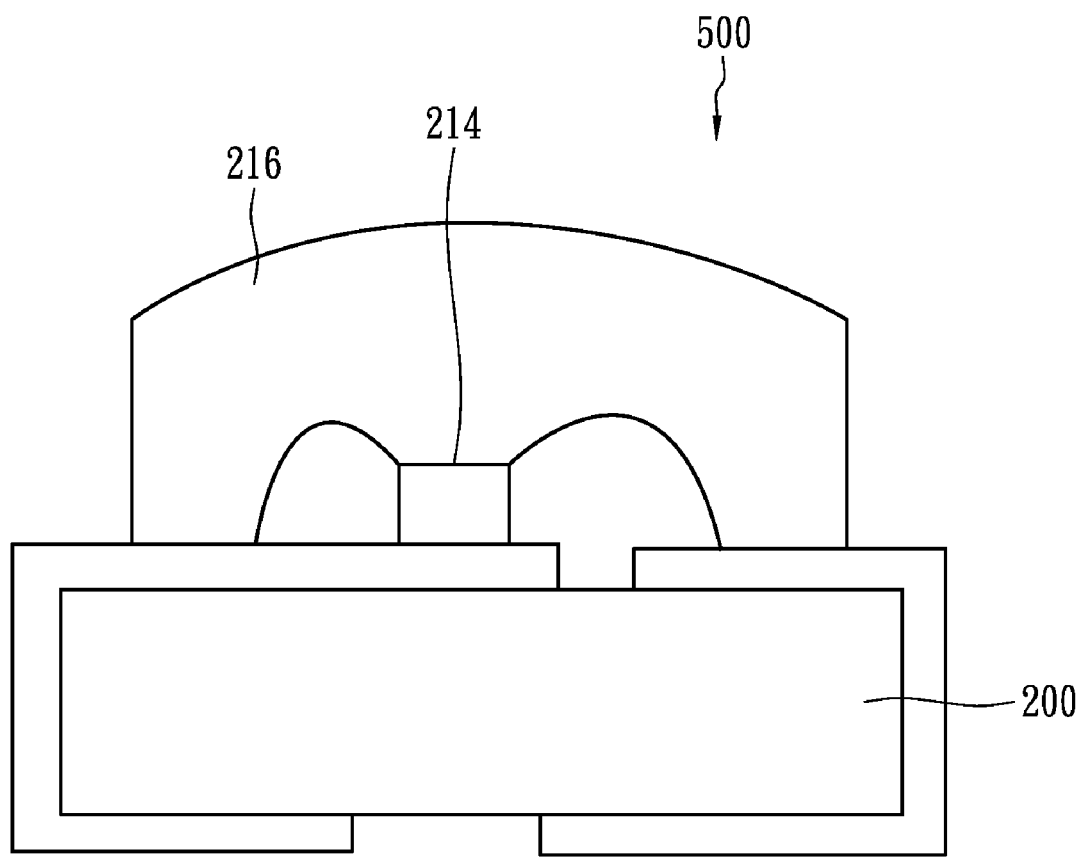
FIG. 7 illustrates the cross-sectional view of an LED in accordance with a second embodiment of the present invention.

Referring to FIG. 4, the surface of the molding unit 216 of the LED 500 may be planar or in other forms. FIG. 7 illustrates the cross-sectional view of an LED in accordance with a second embodiment of the present invention. As shown in FIG. 7, the surface of the molding unit may be a convexly curved surface.

Figure 8:
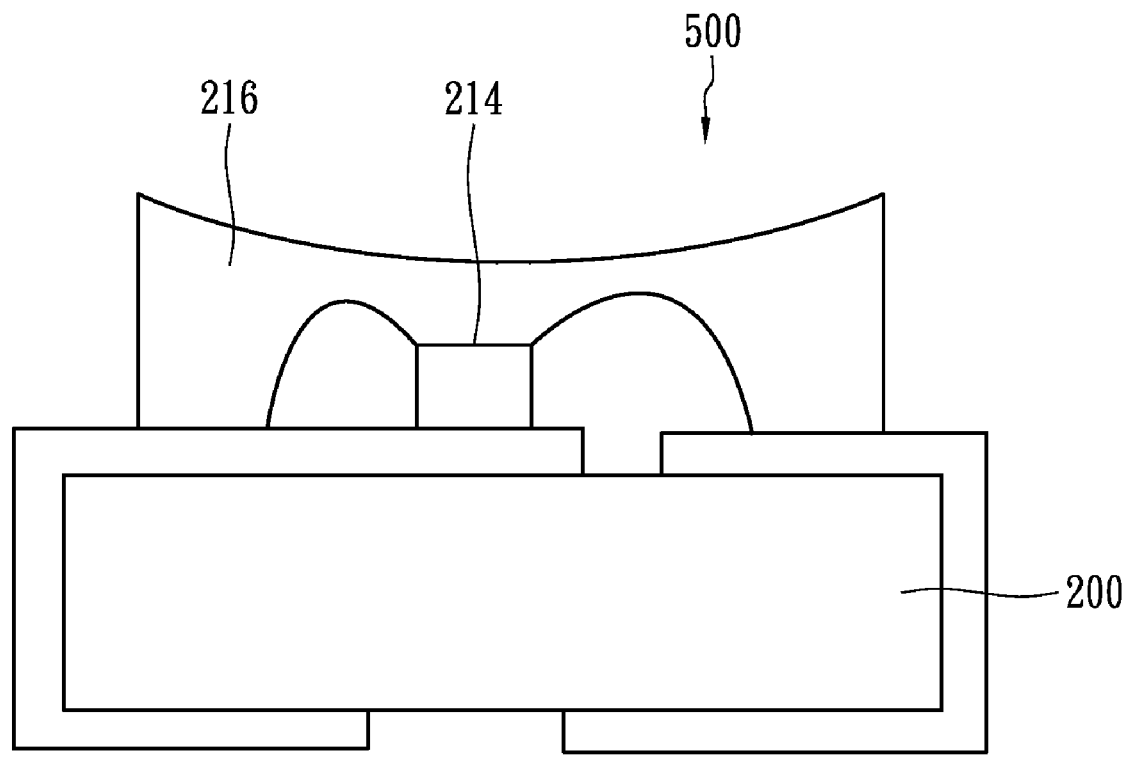
FIG. 8 illustrates the cross-sectional view of an LED in accordance with a third embodiment of the present invention.

FIG. 8 illustrates the cross-sectional view of an LED in accordance with a third embodiment of the present invention, in which the surface of the molding unit 216 is a concavely curved surface.

Figure 9:
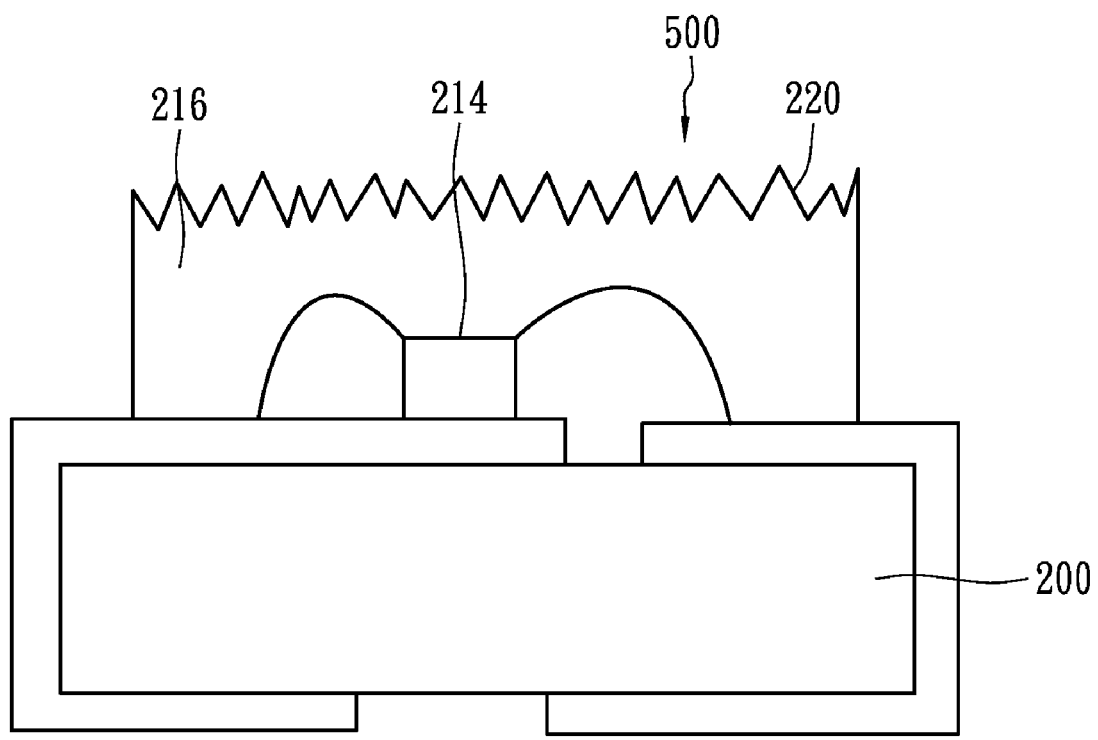
FIG. 9 illustrates the cross-sectional view of an LED in accordance with a fourth embodiment of the present invention.

FIG. 9 illustrates the cross-sectional view of an LED in accordance with a fourth embodiment of the present invention, in which the surface of the molding unit 216 may have irregular micro-structures 220.

Figure 10A:
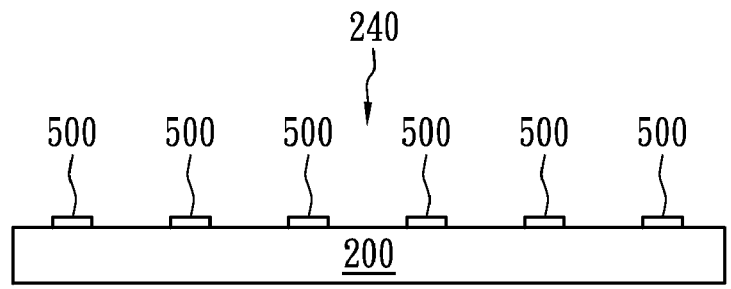
FIG. 10A illustrates the cross-sectional view of a light module in accordance with a fifth embodiment of the present invention.

FIG. 10A illustrates the cross-sectional view of a light module in accordance with a fifth embodiment of the present invention.

Figure 10B:
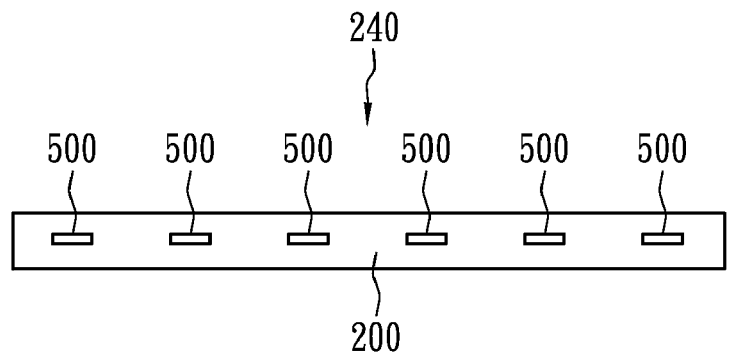
FIG. 10B illustrates the top view of the light module of FIG. 10A.

FIG. 10B illustrates the top view of the light module of FIG. 10A. Referring to FIGS. 10A and 10B, the light module 240 may include the circuit board 200 and a plurality of LEDs 500 of the first, second, third or fourth embodiments. The plurality of the LEDs 500 is arranged on the circuit board 200. Each of LEDs 500 has no reflection portion for converging light. The molding unit 216 of each of the LEDs 500 is electrically connected to the circuit board 200.

Figure 11:
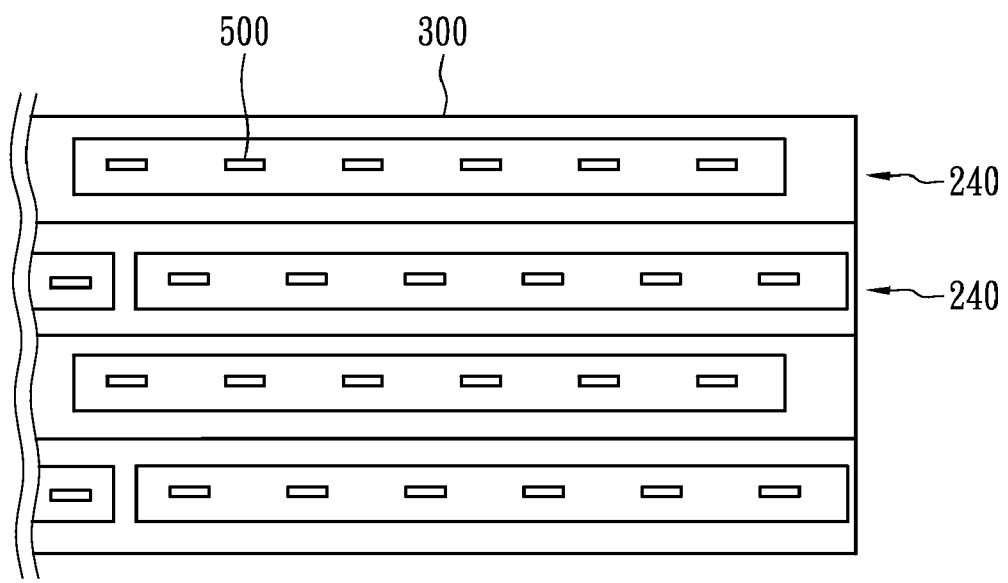
FIG. 11 illustrates the top view of a direct type light module for an LCD backlight module in accordance with a sixth embodiment of the present invention.

FIG. 11 illustrates the top view of a direct type light module for LCD backlight module in accordance with a sixth embodiment of the present invention. The direct type light module for LCD backlight module may include a plurality of the light modules 240 of the fifth embodiment of the present invention.

The plurality of light modules 240 is arranged with each other to form a plane 300. The LEDs 500 of the light modules 240 is interlaced into form a planar illuminant.

One of the common advantages of the above embodiments is that such implementations can reduce the thickness of a backlight module. If the LEDs of the above embodiments are used for the direct type light module of the sixth embodiment, the distance between the LEDs and the light guide panel is less than that of the LEDs shown in FIG. 1.

The above LEDs have no deep cup opening, so that the LEDs can be used in the light module of the LCD backlight module of the sixth embodiment, and accordingly the backlight module can be made with a thin profile. Moreover, the light-emitting area of the LED of the present invention is concentrated, so that lights can be easily mixed to function as a uniform planar illuminant for a planar light module.

Moreover, in comparison with the LEDs using plastic leadframe chip carrier package or bomb-type package, the first to fifth embodiments have another advantage in that the encapsulation of the molding unit can be performed by transfer-molding or inject-molding with lower cost.

The above-described embodiments of the present invention are intended to be illustrative only. Those skilled in the art may devise numerous alternative embodiments without departing from the scope of the following claims.

What is claimed is:

1. A direct type light module for LCD backlight module comprising:
    a plurality of light modules, wherein each of said light modules comprising:
        a circuit board; and
        a plurality of LEDs arranged on said circuit board, each of said LEDs being without any reflection portion for converging light and having a far-field pattern, wherein when a light-emitting angle of each of the LEDs is at 120 degrees, a light intensity thereof is still more than 50% of the intensity at frontage;
        wherein each of said LED chips is electrically connecting with said circuit board;
    and said plurality of light modules is arranged with each other for forming a plane, result in said LEDs on said light modules are interlaced into a planar illuminant.

2. The direct type light module for LCD backlight module as in claim 1, wherein each of said LEDs has a LED chip and a molding unit packaging said LED chip.

3. The direct type light module for LCD backlight module as in claim 2, wherein said LED chip is packaged with said molding unit by transfer-molding or inject-molding.

4. The direct type light module for LCD backlight module as in claim 2, wherein surface of said molding unit is planar, convexly curved, or concavely curved.

5. The direct type light module for LCD backlight module as in claim 4, wherein surface of said molding unit includes a plurality of irregular micro-structures.

6. The direct type light module for LCD backlight module as in claim 2, wherein said molding unit is one of epoxy, silicone, or mixture thereof.

7. The direct type light module for LCD backlight module as in claim 1, wherein said circuit board is one of print circuit board (PCB), ceramic board, aluminum board, alumina board, aluminum nitride board, or copper clad laminate (CCL).

* * * * *